(12) United States Patent
Negley et al.

(10) Patent No.: US 8,529,104 B2
(45) Date of Patent: Sep. 10, 2013

(54) LIGHTING DEVICE

(75) Inventors: Gerald H. Negley, Durham, NC (US); Antony Paul Van De Ven, Hong Kong (CN)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/233,302

(22) Filed: Sep. 15, 2011

(65) Prior Publication Data

US 2012/0018751 A1 Jan. 26, 2012

Related U.S. Application Data

(63) Continuation of application No. 11/751,982, filed on May 22, 2007, now Pat. No. 8,033,692.

(60) Provisional application No. 60/802,709, filed on May 23, 2006, provisional application No. 60/808,702, filed on May 26, 2006.

(51) Int. Cl.
*F21V 7/00* (2006.01)

(52) U.S. Cl.
USPC .......................... 362/341; 362/231; 362/800

(58) Field of Classification Search
USPC ....................................................... 362/341
See application file for complete search history.

(56) References Cited

U.S. PATENT DOCUMENTS

| | | | |
|---|---|---|---|
| 4,042,552 A | 8/1977 | Grucza | |
| 4,107,238 A | 8/1978 | Roper et al. | |
| 4,141,941 A | 2/1979 | Travnicek | |
| 4,562,018 A | 12/1985 | Neefe | |
| 4,650,922 A | 3/1987 | McPherson | |
| 4,794,048 A | 12/1988 | Obaodi et al. | |
| 4,826,424 A | 5/1989 | Arai et al. | |
| 4,918,497 A | 4/1990 | Edmond | |
| 4,935,665 A | 6/1990 | Murata | |
| 4,966,862 A | 10/1990 | Edmond | |
| 5,024,966 A | 6/1991 | Dietrich et al. | |
| 5,027,168 A | 6/1991 | Edmond | |
| 5,087,949 A | 2/1992 | Haitz | |

(Continued)

FOREIGN PATENT DOCUMENTS

CN 1534074 10/2004
EP 0 439 227 7/1991

(Continued)

OTHER PUBLICATIONS

Japanese Office Action from corresponding Japanese Patent Application No. 2009-512102 dated Nov. 27, 2012 (and translation provided by foreign counsel).

(Continued)

*Primary Examiner* — Evan Dzierzynski
(74) *Attorney, Agent, or Firm* — Burr & Brown (57) ABSTRACT

A first lighting device comprises at least one plural cavity element and a plurality of solid state light emitters. A second lighting device comprises at least one plural cavity element, a plurality of solid state light emitters and at least one encapsulant region, at least a portion of the plural cavity element being surrounded by the encapsulant region. Each plural cavity element has at least two optical cavities. Each optical cavity comprises a concave region in the plural cavity element. At least one solid state light emitter is present in each of at least two of the optical cavities.

20 Claims, 4 Drawing Sheets

(56) References Cited

U.S. PATENT DOCUMENTS

| | | |
|---|---|---|
| 5,110,278 A | 5/1992 | Tait et al. |
| 5,143,660 A | 9/1992 | Hamilton et al. |
| 5,166,815 A | 11/1992 | Elderfield |
| 5,210,051 A | 5/1993 | Carter, Jr. |
| 5,277,840 A | 1/1994 | Osaka et al. |
| 5,298,768 A | 3/1994 | Okazaki et al. |
| 5,338,944 A | 8/1994 | Edmond et al. |
| 5,374,668 A | 12/1994 | Kanemura et al. |
| 5,393,993 A | 2/1995 | Edmond et al. |
| 5,416,342 A | 5/1995 | Edmond et al. |
| 5,523,589 A | 6/1996 | Edmond et al. |
| 5,604,135 A | 2/1997 | Edmond et al. |
| 5,631,190 A | 5/1997 | Negley |
| 5,669,486 A | 9/1997 | Shima |
| 5,739,554 A | 4/1998 | Edmond et al. |
| 5,753,730 A | 5/1998 | Nagata et al. |
| 5,813,753 A | 9/1998 | Vriens et al. |
| 5,851,063 A | 12/1998 | Doughty et al. |
| 5,857,767 A | 1/1999 | Hochstein |
| 5,858,278 A | 1/1999 | Itoh et al. |
| 5,882,553 A | 3/1999 | Prophet et al. |
| 5,912,477 A | 6/1999 | Negley |
| 5,959,316 A | 9/1999 | Lowery |
| 5,968,422 A | 10/1999 | Kennedy |
| 6,060,729 A | 5/2000 | Suzuki et al. |
| 6,066,861 A | 5/2000 | Hohn et al. |
| 6,069,440 A | 5/2000 | Shimizu et al. |
| 6,120,600 A | 9/2000 | Edmond et al. |
| 6,156,242 A | 12/2000 | Saito et al. |
| 6,177,688 B1 | 1/2001 | Linthicum et al. |
| 6,184,544 B1 | 2/2001 | Toda et al. |
| 6,187,606 B1 | 2/2001 | Edmond et al. |
| 6,201,262 B1 | 3/2001 | Edmond et al. |
| 6,219,223 B1 | 4/2001 | Kobayashi et al. |
| 6,245,259 B1 | 6/2001 | Hohn et al. |
| 6,252,254 B1 | 6/2001 | Soules et al. |
| 6,329,676 B1 | 12/2001 | Takayama et al. |
| 6,346,973 B1 | 2/2002 | Shibamoto et al. |
| 6,373,188 B1 | 4/2002 | Johnson et al. |
| 6,383,417 B1 | 5/2002 | Paulson et al. |
| 6,391,231 B1 | 5/2002 | Evans et al. |
| 6,404,125 B1 | 6/2002 | Garbuzov et al. |
| 6,429,583 B1 | 8/2002 | Levinson et al. |
| 6,480,389 B1 | 11/2002 | Shie et al. |
| 6,498,355 B1 | 12/2002 | Harrah et al. |
| 6,517,218 B2 | 2/2003 | Hochstein |
| 6,521,915 B2 | 2/2003 | Odaki et al. |
| 6,522,065 B1 | 2/2003 | Srivastava et al. |
| 6,531,328 B1 | 3/2003 | Chen |
| 6,562,643 B2 | 5/2003 | Chen |
| 6,576,930 B2 | 6/2003 | Reeh et al. |
| 6,577,073 B2 | 6/2003 | Shimizu et al. |
| 6,599,768 B1 | 7/2003 | Chen |
| 6,635,503 B2 | 10/2003 | Andrews et al. |
| 6,638,780 B2 | 10/2003 | Fukasawa et al. |
| 6,639,356 B2 | 10/2003 | Chin |
| 6,686,609 B1 | 2/2004 | Sung |
| 6,707,069 B2 | 3/2004 | Song et al. |
| 6,730,939 B2 | 5/2004 | Eisert et al. |
| 6,734,465 B1 | 5/2004 | Taskar et al. |
| 6,744,077 B2 | 6/2004 | Trottier |
| 6,783,362 B2 | 8/2004 | Cao |
| 6,789,921 B1 | 9/2004 | Deloy et al. |
| 6,791,119 B2 | 9/2004 | Slater, Jr. et al. |
| 6,791,151 B2 | 9/2004 | Lin et al. |
| 6,794,684 B2 | 9/2004 | Slater, Jr. et al. |
| 6,824,294 B2 | 11/2004 | Cao |
| 6,841,933 B2 | 1/2005 | Yamanaka et al. |
| 6,853,131 B2 | 2/2005 | Srivastava et al. |
| 6,871,981 B2 | 3/2005 | Alexanderson et al. |
| 6,885,033 B2 | 4/2005 | Andrews et al. |
| 6,900,511 B2 | 5/2005 | Ruhnau et al. |
| 6,921,927 B2 | 7/2005 | Ng et al. |
| 6,922,024 B2 | 7/2005 | Yano et al. |
| 6,948,840 B2 | 9/2005 | Grenda et al. |
| 6,958,497 B2 | 10/2005 | Emerson et al. |
| 6,960,878 B2 | 11/2005 | Sakano et al. |
| 7,001,059 B2 | 2/2006 | Han et al. |
| 7,029,935 B2 | 4/2006 | Negley et al. |
| 7,118,262 B2 | 10/2006 | Negley et al. |
| 7,183,587 B2 | 2/2007 | Negley et al. |
| 7,213,940 B1 | 5/2007 | Van De Ven et al. |
| 7,217,583 B2 | 5/2007 | Negley et al. |
| 7,252,408 B2 | 8/2007 | Mazzochette et al. |
| 7,259,403 B2 | 8/2007 | Shimizu et al. |
| 7,264,378 B2 | 9/2007 | Loh et al. |
| 7,304,694 B2 | 12/2007 | Negley et al. |
| 7,322,732 B2 | 1/2008 | Negley et al. |
| 7,372,198 B2 | 5/2008 | Negley et al. |
| 7,405,094 B2 | 7/2008 | Andrews et al. |
| 7,435,997 B2 | 10/2008 | Arndt et al. |
| 2002/0006044 A1 | 1/2002 | Harbers et al. |
| 2002/0123164 A1 | 9/2002 | Slater, Jr. et al. |
| 2002/0172354 A1 | 11/2002 | Nishi |
| 2003/0006418 A1 | 1/2003 | Emerson et al. |
| 2003/0006469 A1 | 1/2003 | Ellens et al. |
| 2003/0030060 A1 | 2/2003 | Okazaki |
| 2003/0032212 A1 | 2/2003 | Wang et al. |
| 2003/0038291 A1 | 2/2003 | Cao |
| 2003/0038295 A1 | 2/2003 | Koda |
| 2003/0067264 A1 | 4/2003 | Takekuma |
| 2003/0080341 A1 | 5/2003 | Sakano et al. |
| 2003/0089918 A1 | 5/2003 | Hiller et al. |
| 2003/0098459 A1 | 5/2003 | Horiuchi et al. |
| 2003/0128313 A1 | 7/2003 | Kaminsky et al. |
| 2003/0151343 A1 | 8/2003 | Jeganathan et al. |
| 2003/0153861 A1 | 8/2003 | Royer |
| 2003/0168663 A1 | 9/2003 | Slater, Jr. et al. |
| 2003/0173575 A1 | 9/2003 | Eisert et al. |
| 2003/0189829 A1 | 10/2003 | Shimizu et al. |
| 2003/0189830 A1 | 10/2003 | Sugimoto et al. |
| 2004/0041222 A1 | 3/2004 | Loh |
| 2004/0041757 A1 | 3/2004 | Yang et al. |
| 2004/0051118 A1 | 3/2004 | Bruhns et al. |
| 2004/0056260 A1 | 3/2004 | Slater, Jr. et al. |
| 2004/0065894 A1 | 4/2004 | Hashimoto et al. |
| 2004/0066556 A1 | 4/2004 | Dontula et al. |
| 2004/0067366 A1 | 4/2004 | Gorczyca |
| 2004/0079957 A1 | 4/2004 | Andrews et al. |
| 2004/0095738 A1 | 5/2004 | Juang |
| 2004/0105264 A1 | 6/2004 | Spero |
| 2004/0120155 A1 | 6/2004 | Suenaga |
| 2004/0124429 A1 | 7/2004 | Stokes |
| 2004/0136202 A1 | 7/2004 | Ishida et al. |
| 2004/0211970 A1 | 10/2004 | Hayashimoto et al. |
| 2004/0222433 A1 | 11/2004 | Mazzochette et al. |
| 2004/0253427 A1 | 12/2004 | Yokogawa et al. |
| 2004/0264212 A1 | 12/2004 | Chung et al. |
| 2005/0023551 A1 | 2/2005 | Mizuyoshi |
| 2005/0045903 A1 | 3/2005 | Abe et al. |
| 2005/0073846 A1 | 4/2005 | Takine |
| 2005/0092980 A1 | 5/2005 | Chen et al. |
| 2005/0224830 A1 | 10/2005 | Blonder |
| 2005/0237747 A1 | 10/2005 | Shimizu et al. |
| 2006/0011922 A1 | 1/2006 | Schmidt |
| 2006/0012298 A1 | 1/2006 | Lee et al. |
| 2006/0023448 A1 | 2/2006 | Mok et al. |
| 2006/0023451 A1 | 2/2006 | Han et al. |
| 2006/0043879 A1* | 3/2006 | Naitou ................ 313/501 |
| 2006/0049475 A1 | 3/2006 | Wang et al. |
| 2006/0065957 A1 | 3/2006 | Hanya |
| 2006/0067640 A1 | 3/2006 | Hsieh et al. |
| 2006/0077685 A1 | 4/2006 | Hsieh et al. |
| 2006/0083281 A1 | 4/2006 | Inoguchi |
| 2006/0087844 A1* | 4/2006 | Swaris et al. ........... 362/249 |
| 2006/0087866 A1 | 4/2006 | Ng et al. |
| 2006/0091416 A1 | 5/2006 | Yan |
| 2006/0097245 A1 | 5/2006 | Aanegola et al. |
| 2006/0097385 A1 | 5/2006 | Negley |
| 2006/0124953 A1 | 6/2006 | Negley |
| 2006/0261366 A1* | 11/2006 | Yang ....................... 257/100 |
| 2007/0018181 A1 | 1/2007 | Steen |
| 2007/0064420 A1 | 3/2007 | Ng et al. |
| 2007/0104963 A1 | 5/2007 | Hsieh et al. |

| | | | |
|---|---|---|---|
| 2007/0139920 | A1 | 6/2007 | Van de Ven |
| 2007/0139923 | A1 | 6/2007 | Van de Ven et al. |
| 2007/0223219 | A1 | 9/2007 | Medendorp et al. |
| 2007/0263393 | A1 | 11/2007 | Van de Ven |
| 2007/0267983 | A1 | 11/2007 | Van de Ven |
| 2007/0278934 | A1 | 12/2007 | Van de Ven |
| 2008/0112156 | A1 | 5/2008 | Hsieh et al. |
| 2009/0134421 | A1 | 5/2009 | Negley |
| 2010/0133555 | A1 | 6/2010 | Negley |
| 2011/0210360 | A1 | 9/2011 | Negley |

FOREIGN PATENT DOCUMENTS

| | | |
|---|---|---|
| EP | 1 045 458 | 10/2000 |
| EP | 1 059 667 | 12/2000 |
| EP | 1 139 439 | 10/2001 |
| GB | 2 371 629 | 7/2002 |
| GB | 2 373 368 | 9/2002 |
| JP | 3-3762 | 1/1991 |
| JP | 04-159519 | 6/1992 |
| JP | 05-152609 | 6/1993 |
| JP | 06-151974 | 5/1994 |
| JP | 06-177429 | 6/1994 |
| JP | 06-244458 | 9/1994 |
| JP | 08-116095 | 5/1996 |
| JP | 08-162676 | 6/1996 |
| JP | 09-083018 | 3/1997 |
| JP | 09-146089 | 6/1997 |
| JP | 09-246603 | 9/1997 |
| JP | 10-098215 | 4/1998 |
| JP | 10-242513 | 9/1998 |
| JP | 11-261114 | 9/1999 |
| JP | 11-298047 | 10/1999 |
| JP | 2000-101147 | 4/2000 |
| JP | 2000-174347 | 6/2000 |
| JP | 2000-183405 | 6/2000 |
| JP | 2000-286455 | 10/2000 |
| JP | 2000-286458 | 10/2000 |
| JP | 2000-347601 | 12/2000 |
| JP | 2001-077427 | 3/2001 |
| JP | 2001-077433 | 3/2001 |
| JP | 2001-144334 | 5/2001 |
| JP | 2001-230453 | 8/2001 |
| JP | 2002-118293 | 4/2002 |
| JP | 2002-158378 | 5/2002 |
| JP | 2002-223004 | 8/2002 |
| JP | 2002-280616 | 9/2002 |
| JP | 2003-017755 | 1/2003 |
| JP | 2003-224307 | 8/2003 |
| JP | 2003-243718 | 8/2003 |
| JP | 2003-318448 | 11/2003 |
| JP | 2004-080046 | 3/2004 |
| JP | 2006-120748 | 5/2006 |
| TW | 475780 | 2/2002 |
| TW | 200541110 A | 12/2005 |
| TW | I249257 B | 2/2006 |
| WO | 97/24706 | 7/1997 |
| WO | 01/43113 | 6/2001 |
| WO | 01/61764 | 8/2001 |
| WO | 02/059982 | 8/2002 |
| WO | 03/030274 | 4/2003 |
| WO | 03/056876 | 7/2003 |
| WO | 03/091771 | 11/2003 |

OTHER PUBLICATIONS

Aavid Thermalloy, LLC, "Extrusion Profiles," retrieved Oct. 18, 2004 from http://222.aavidthermalloy.com/products/extrusion/index.shtml.

Cabot Corporation, "Using Nanogel in Daylighting Systems," retrieved Jan. 11, 2005 from http://w1.cabot-corp.com/Controller.jsp? . . . .

Compound Semiconductors Online, "LED Lighting Fixtures, Inc. Sets World Record at 80 Lumens per Watt for Warm White", Compound Semiconductors Online, May 30, 2006, pp. 1.

Craford, "Overview of Device Issues in High-Brightness Light-Emitting Diodes," Chapter, *High Brightness Light Emitting Diodes: Semiconductors and Semimetals*, vol. 48, Stringfellow et al. ed., Academic Press, 1997, pp. 47-63.

Cree, Inc., *Cree Optoelectronics LED Product Line*, Publication CPR3AX, Rev. D, 2001-2002.

CSA International, "Test Data Report," Project No. 1786317, Report No. 1786317-1 (Apr. 2006).

DOE SSL CALiPer Report, "Product Test Reference: CALiPER 07-31 Downlight Lamp", (Sep. 2007).

DOE SSL CALiPer Report, "Product Test Reference: CALiPER 07-47 Downlight Lamp" (Sep. 2007).

Heatron, "ELPOR® Product Information," retrieved Oct. 6, 2004 from http://www.heatron.com.

Heatron, "Metal Core PCBs for LED Light Engines" (Product Brochure), retrieved Oct. 6, 2004 from http://www.heatron.com.

IRC Advanced Film Division, "Insulated Aluminum Substrates" (Product Brochure) retrieved from http://www.irctt.com, copyright 2002.

IRC Advanced Film Division, "Thick Film Application Specific Capabilities" (Product Brochure) retrieved from http://www.irctt.com, copyright 2002.

Morris, "IRC's Anotherm™ PC Boards Eliminate Heat for Automotive LED Applications," Mar. 16, 2004 Press Release, retrieved Sep. 17, 2004 from http://www.irctt.com/pages/Anotherm_PressRelease.cfm.

Press Release from LED Lighting Fixtures dated Apr. 24, 2006 entitled "LED Lighting Fixtures, Inc. achieves unprecedented gain in light output from new luminaire".

Press Release from LED Lighting Fixtures dated Feb. 16, 2006 entitled "LED Lighting Fixtures, Inc. Announces Record Performance".

Press Release from LED Lighting Fixtures dated Feb. 7, 2007 entitled "LED Lighting Fixtures Announces its first LED-based Recessed Down Light".

Press Release from LED Lighting Fixtures dated Jan. 26, 2006 entitled "LED Lighting Fixtures Creates 750 Lumen Recessed Light and Uses Only 16 Watts of Power".

Press Release from LED Lighting Fixtures dated May 30, 2006 entitled "LED Lighting Fixtures, Inc. Sets World Record at 80 Lumens per Watt for Warm White Fixture".

Press Release from LED Lighting Fixtures dated May 4, 2007 entitled "LED Lighting Fixtures to Expand Product Line".

Press Release from LED Lighting Fixtures dated Nov. 28, 2007 entitled "New Lamp from LED Lighting Fixtures Shatter World Record for Energy Efficiency".

Shimizu, "Development of High-Efficiency LED Downlight", First International Conference on White LEDs and Solid State Lighting, Nov. 30, 2007.

U.S. Department of Energy, "DOE Solid-State Lighting CALiPER Program, Summary of Results: Round 3 of Product Testing," Oct. 2007.

U.S. Department of Energy, "DOE Solid-State Lighting CALiPER Program, Summary of Results: Round 4 of Product Testing," Jan. 2008.

U.S. Department of Energy, "DOE Solid-State Lighting CALiPER Program, Summary of Results: Round 5 of Product Testing," May 2008.

Van De Ven et al., "Warm White Illumination with High CRI and High Efficacy by Combining 455 nm Excited Yellowish Phosphor LEDs and Red AlInGaP LEDs," First International Conference on White LEDs and Solid State Lighting, Nov. 30, 2007.

Cabot Corporation, "Using Nanogel in Daylighting Systems," retrieved Jan. 11, 2005 from http://w1.cabot.corp.com/Controller.jsp? . . . .

Cree, Inc., "Cree Optoelectronics LED Product Line," Publication CPR3AX, Rev. D, 2001-2002.

Heatron, "Metal Core PCBs for LED Light Engines (Product Brochure)." retrieved from http://www.heatron.com.

IRC Advanced Film Division, "Thick Film Application Specific Capabilities (Product Brochure)" retrieved from http://www.irctt.com, copyright 2002.

Taiwan Office Action (and translation provided by foreign counsel) from a corresponding Taiwan patent application bearing a mailing date of Mar. 13, 2013, 9 pages.

\* cited by examiner

LIGHTING DEVICE

CROSS-REFERENCE TO RELATED APPLICATIONS

This application claims the benefit of U.S. Provisional Patent Application No. 60/802,709, filed May 23, 2006, the entirety of which is incorporated herein by reference.

This application claims the benefit of U.S. Provisional Patent Application No. 60/808,702, filed May 26, 2006, the entirety of which is incorporated herein by reference.

This application is a continuation of U.S. patent application Ser. No. 11/751,982, filed May 22, 2007 (now U.S. Pat. No. 8,033,692 B2), the entirety of which is incorporated herein by reference as if set forth in its entirety.

FIELD OF THE INVENTION

The present invention relates to a lighting device, in particular, a device which includes one or more solid state light emitters. The present invention also relates to a method of making a lighting device, in particular, a device which includes one or more solid state light emitters.

BACKGROUND OF THE INVENTION

A large proportion (some estimates are as high as twenty-five percent) of the electricity generated in the United States each year goes to lighting. Accordingly, there is an ongoing need to provide lighting which is more energy-efficient. It is well-known that incandescent light bulbs are very energy-inefficient light sources—about ninety percent of the electricity they consume is released as heat rather than light. Fluorescent light bulbs are more efficient than incandescent light bulbs (by a factor of about 10) but are still less efficient as compared to solid state light emitters, such as light emitting diodes.

In addition, as compared to the normal lifetimes of solid state light emitters, e.g., light emitting diodes, incandescent light bulbs have relatively short lifetimes, i.e., typically about 750-1000 hours. In comparison, light emitting diodes, for example, have typical lifetimes between 50,000 and 70,000 hours). Fluorescent bulbs have longer lifetimes (e.g., 10,000-20,000 hours) than incandescent lights, but provide less favorable color reproduction.

Color reproduction is typically measured using the Color Rendering Index (CRI Ra). CRI Ra is a modified average of the relative measurements of how the color rendition of an illumination system compares to that of a reference radiator when illuminating eight reference colors, i.e., it is a relative measure of the shift in surface color of an object when lit by a particular lamp. The CRI Ra equals 100 if the color coordinates of a set of test colors being illuminated by the illumination system are the same as the coordinates of the same test colors being irradiated by the reference radiator. Daylight has a high CRI (Ra of approximately 100), with incandescent bulbs also being relatively close (Ra greater than 95), and fluorescent lighting being less accurate (typical Ra of 70-80). Certain types of specialized lighting have very low CRI (e.g., mercury vapor or sodium lamps, have Ra as low as about 40 or even lower).

Another issue faced by conventional light fixtures is the need to periodically replace the lighting devices (e.g., light bulbs, etc.). Such issues are particularly pronounced where access is difficult (e.g., vaulted ceilings, bridges, high buildings, traffic tunnels) and/or where change-out costs are extremely high. The typical lifetime of conventional fixtures is about 20 years, corresponding to a light-producing device usage of at least about 44,000 hours (based on usage of 6 hours per day for 20 years). Light-producing device lifetime is typically much shorter, thus creating the need for periodic change-outs.

Accordingly, for these and other reasons, efforts have been ongoing to develop ways by which light emitting diodes and other solid state light emitters can be used in place of incandescent lights, fluorescent lights and other light-generating devices in a wide variety of applications. In addition, where light emitting diodes (or other solid state light emitters) are already being used, efforts are ongoing to provide light emitting diodes (or other solid state light emitters) which are improved, e.g., with respect to energy efficiency, color rendering index (CRI Ra), contrast, efficacy (1 m/W), cost, and/or duration of service.

A variety of solid state light emitters are well-known. Light emitting diodes are well-known semiconductor devices that convert electrical current into light. A wide variety of light emitting diodes are used in increasingly diverse fields for an ever-expanding range of purposes.

More specifically, light emitting diodes are semiconducting devices that emit light (ultraviolet, visible, or infrared) when a potential difference is applied across a p-n junction structure. There are a number of well-known ways to make light emitting diodes and many associated structures, and the present invention can employ any such devices. By way of example, Chapters 12-14 of Sze, Physics of Semiconductor Devices, (2d Ed. 1981) and Chapter 7 of Sze, Modem Semiconductor Device Physics (1998) describe a variety of photonic devices, including light emitting diodes.

The expression "light emitting diode" is used herein to refer to the basic semiconductor diode structure (i.e., the chip). The commonly recognized and commercially available "LED" that is sold (for example) in electronics stores typically represents a "packaged" device made up of a number of parts. These packaged devices typically include a semiconductor based light emitting diode such as (but not limited to) those described in U.S. Pat. Nos. 4,918,487; 5,631,190; and 5,912,477, various wire connections, and a package that encapsulates the light emitting diode.

As is well-known, a light emitting diode produces light by exciting electrons across the band gap between a conduction band and a valence band of a semiconductor active (light-emitting) layer. The electron transition generates light at a wavelength that depends on the band gap. Thus, the color of the light (wavelength) emitted by a light emitting diode depends on the semiconductor materials of the active layers of the light emitting diode.

Because light that is perceived as white is necessarily a blend of light of two or more colors (or wavelengths), no single light emitting diode junction has been developed that can produce white light. "White" light emitting diode lamps have been produced which have a light emitting diode pixel formed of respective red, green and blue light emitting diodes.

Another "white" LED lamp which has been produced includes (1) a light emitting diode which generates blue light and (2) a luminescent material (e.g., a phosphor) that emits yellow light in response to excitation by light emitted by the light emitting diode, whereby the blue light and the yellow light, when mixed, produce light that is perceived as white light.

In addition, the blending of primary colors to produce combinations of non-primary colors is generally well understood in this and other arts.

Figure 1:
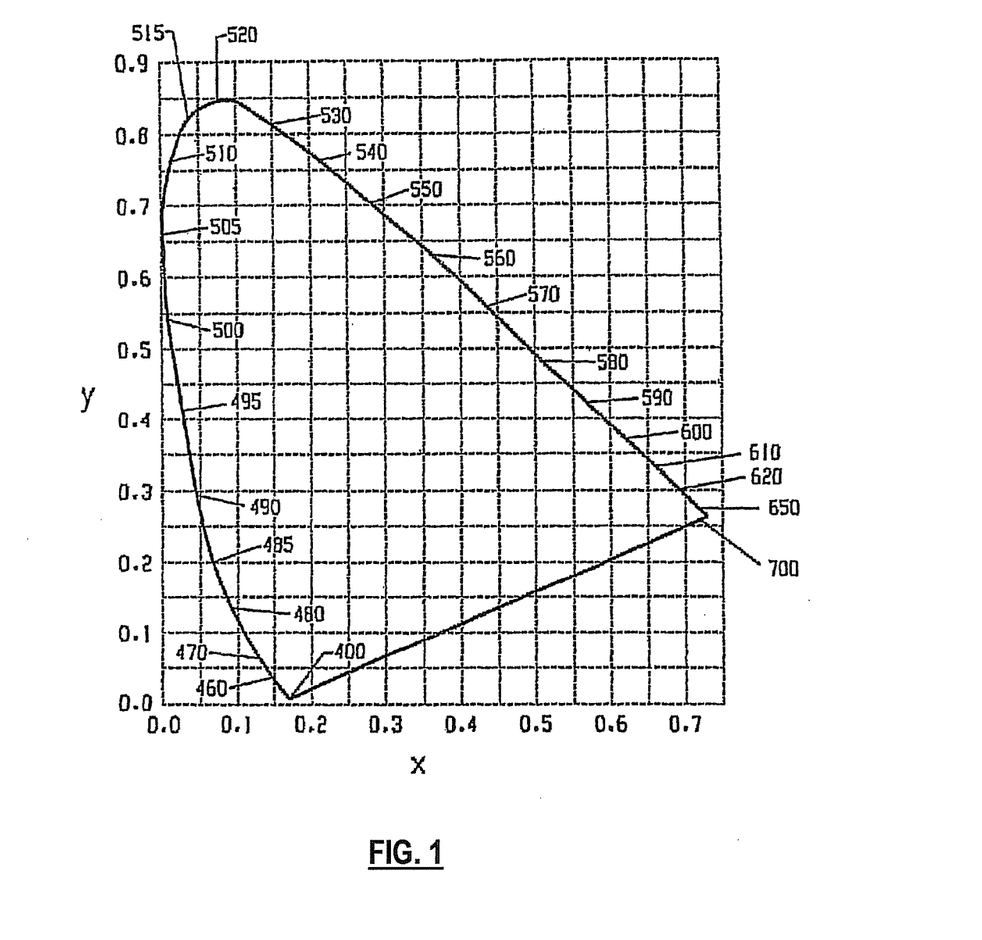
FIG. 1 shows the 1931 CIE Chromaticity Diagram.
Figure 2:
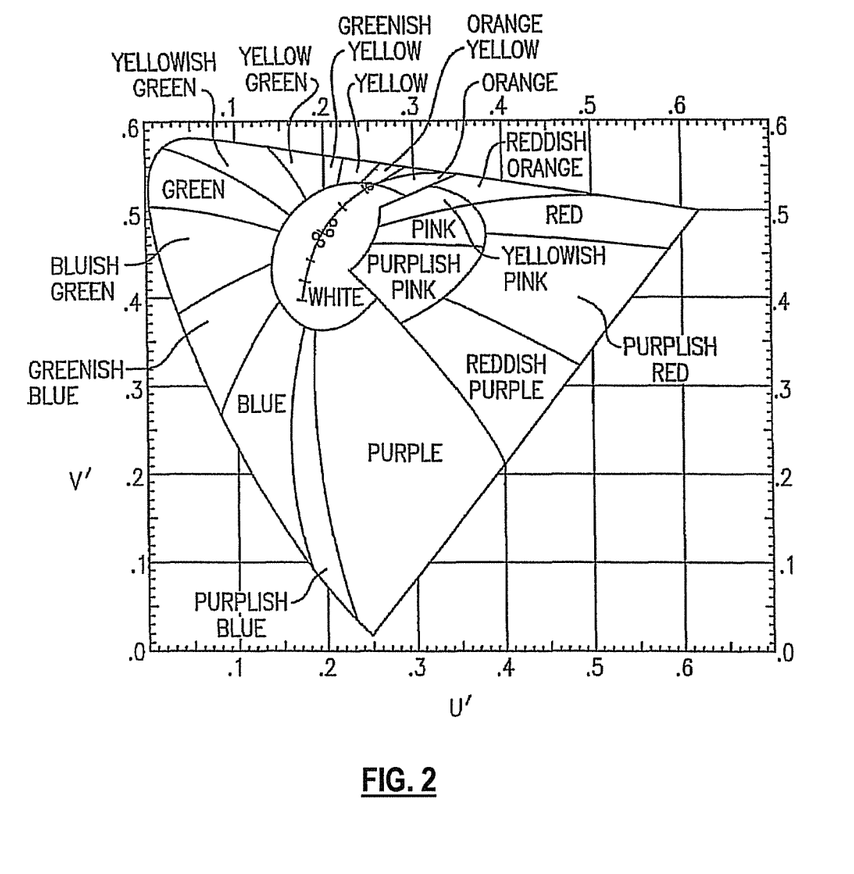
FIG. 2 shows the 1976 Chromaticity Diagram.
Figure 3:
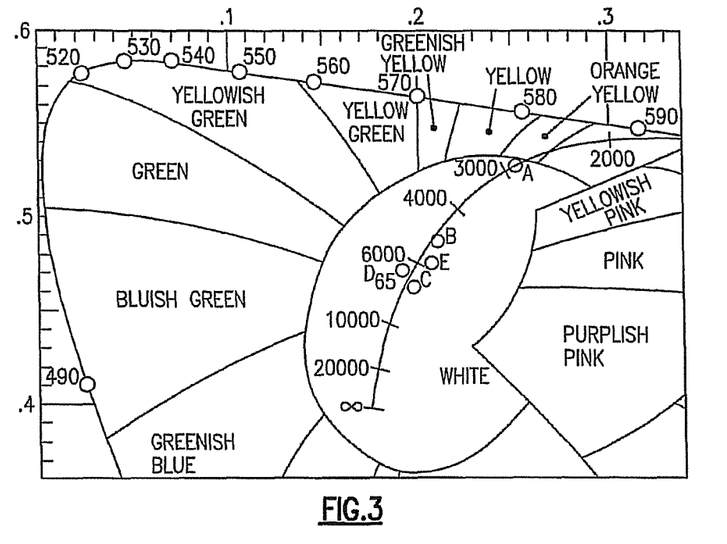
FIG. 3 shows an enlarged portion of the 1976 Chromaticity Diagram, in order to show the blackbody locus in detail.

Aspects related to the present invention can be represented on either the 1931 CIE (Commission International de l'Eclairage) Chromaticity Diagram or the 1976 CIE Chromaticity Diagram. FIG. 1 shows the 1931 CIE Chromaticity Diagram. FIG. 2 shows the 1976 Chromaticity Diagram. FIG. 3 shows an enlarged portion of the 1976 Chromaticity Diagram, in order to show the blackbody locus in more detail. Persons of skill in the art are familiar with these diagrams, and these diagrams are readily available (e.g., by searching "CIE Chromaticity Diagram" on the internet).

The CIE, Chromaticity Diagrams map out the human color perception in terms of two CIE parameters x and y (in the case of the 1931 diagram) or u' and v' (in the case of the 1976 diagram). For a technical description of CIE, chromaticity diagrams, see, for example, "Encyclopedia of Physical Science and Technology", vol. 7, 230-231 (Robert A Meyers ed., 1987). The spectral colors are distributed around the edge of the outlined space, which includes all of the hues perceived by the human eye. The boundary line represents maximum saturation for the spectral colors. As noted above, the 1976 CIE, Chromaticity Diagram is similar to the 1931 Diagram, except that the 1976 Diagram has been modified such that similar distances on the Diagram represent similar perceived differences in color.

In the 1931 Diagram, deviation from a point on the Diagram can be expressed either in terms of the coordinates or, alternatively, in order to give an indication as to the extent of the perceived difference in color, in terms of MacAdam ellipses. For example, a locus of points defined as being ten MacAdam ellipses from a specified hue defined by a particular set of coordinates on the 1931 Diagram consists of hues which would each be perceived as differing from the specified hue to a common extent (and likewise for loci of points defined as being spaced from a particular hue by other quantities of MacAdam ellipses).

Since similar distances on the 1976 Diagram represent similar perceived differences in color, deviation from a point on the 1976 Diagram can be expressed in terms of the coordinates, u' and v', e.g., distance from the point=$(\Delta u'^2 + \Delta v'^2)^{1/2}$, and the hues defined by a locus of points which are each a common distance from a specified hue consist of hues which would each be perceived as differing from the specified hue to a common extent.

The chromaticity coordinates and the CIE chromaticity diagrams illustrated in FIGS. 1-3 are explained in detail in a number of books and other publications, such as pages 98-107 of K. H. Butler, "Fluorescent Lamp Phosphors" (The Pennsylvania State University Press 1980) and pages 109-110 of G. Blasse et al., "Luminescent Materials" (Springer-Verlag 1994), both incorporated herein by reference.

The chromaticity coordinates (i.e., color points) that lie along the blackbody locus obey Planck's equation: $E(\lambda)=A \lambda^{-5}/(e^{B/T}-1)$, where E is the emission intensity, $\lambda$ is the emission wavelength, T the color temperature of the blackbody and A and B are constants. Color coordinates that lie on or near the blackbody locus yield pleasing white light to a human observer. The 1976 CIE Diagram includes temperature listings along the blackbody locus. These temperature listings show the color path of a blackbody radiator that is caused to increase to such temperatures. As a heated object becomes incandescent, it first glows reddish, then yellowish, then white, and finally blueish. This occurs because the wavelength associated with the peak radiation of the blackbody radiator becomes progressively shorter with increased temperature, consistent with the Wien Displacement Law. Illuminants which produce light which is on or near the blackbody locus can thus be described in terms of their color temperature.

Also depicted on the 1976 CIE Diagram are designations A, B, C, D and E, which refer to light produced by several standard illuminants correspondingly identified as illuminants A, B, C, D and E, respectively.

Light emitting diodes can thus be used individually or in any combinations, optionally together with one or more luminescent material (e.g., phosphors or scintillators) and/or filters, to generate light of any desired perceived color (including white). Accordingly, the areas in which efforts are being made to replace existing light sources with light emitting diode light sources, e.g., to improve energy efficiency, color rendering index (CRI Ra), efficacy (1 m/W), and/or duration of service, are not limited to any particular color or color blends of light.

A wide variety of luminescent materials (also known as lumiphors or luminophoric media, e.g., as disclosed in U.S. Pat. No. 6,600,175, the entirety of which is hereby incorporated by reference) are well-known and available to persons of skill in the art. For example, a phosphor is a luminescent material that emits a responsive radiation (e.g., visible light) when excited by a source of exciting radiation. In many instances, the responsive radiation has a wavelength which is different from the wavelength of the exciting radiation. Other examples of luminescent materials include scintillators, day glow tapes and inks which glow in the visible spectrum upon illumination with ultraviolet light.

Luminescent materials can be categorized as being down-converting, i.e., a material which converts photons to a lower energy level (longer wavelength) or up-converting, i.e., a material which converts photons to a higher energy level (shorter wavelength).

Inclusion of luminescent materials in LED devices has been accomplished by adding the luminescent materials to a clear or transparent encapsulant material (e.g., epoxy-based, silicone-based, glass-based or metal oxide-based material) as discussed above, for example by a blending or coating process.

For example, U.S. Pat. No. 6,963,166 (Yano '166) discloses that a conventional light emitting diode lamp includes a light emitting diode chip, a bullet-shaped transparent housing to cover the light emitting diode chip, leads to supply current to the light emitting diode chip, and a cup reflector for reflecting the emission of the light emitting diode chip in a unifolin direction, in which the light emitting diode chip is encapsulated with a first resin portion, which is further encapsulated with a second resin portion. According to Yano '166, the first resin portion is obtained by filling the cup reflector with a resin material and curing it after the light emitting diode chip has been mounted onto the bottom of the cup reflector and then has had its cathode and anode electrodes electrically connected to the leads by way of wires. According to Yano '166, a phosphor is dispersed in the first resin portion so as to be excited with the light A that has been emitted from the light emitting diode chip, the excited phosphor produces fluorescence ("light B") that has a longer wavelength than the light A, a portion of the light A is transmitted through the first resin portion including the phosphor, and as a result, light C, as a mixture of the light A and light B, is used as illumination.

As noted above, "white LED lamps" (i.e., lights which are perceived as being white or near-white) have been investigated as potential replacements for white incandescent lamps. A representative example of a white LED lamp includes a package of a blue light emitting diode chip, made of indium gallium nitride (InGaN) or gallium nitride (GaN), coated with a phosphor such as YAG. In such an LED lamp, the blue light emitting diode chip produces an emission with a wavelength of about 450 nm, and the phosphor produces yellow fluorescence with a peak wavelength of about 550 nm on receiving that emission. For instance, in some designs, white light emitting diode lamps are fabricated by forming a ceramic phosphor layer on the output surface of a blue light-emitting semiconductor light emitting diode. Part of the blue ray emitted from the light emitting diode chip passes through the phosphor, while part of the blue ray emitted from the light emitting diode chip is absorbed by the phosphor, which becomes excited and emits a yellow ray. The part of the blue light emitted by the light emitting diode which is transmitted through the phosphor is mixed with the yellow light emitted by the phosphor. The viewer perceives the mixture of blue and yellow light as white light.

As also noted above, in another type of LED lamp, a light emitting diode chip that emits an ultraviolet ray is combined with phosphor materials that produce red (R), green (G) and blue (B) light rays. In such an LED lamp, the ultraviolet ray that has been radiated from the light emitting diode chip excites the phosphor, causing the phosphor to emit red, green and blue light rays which, when mixed, are perceived by the human eye as white light. Consequently, white light can also be obtained as a mixture of these light rays.

Although the development of light emitting diodes has in many ways revolutionized the lighting industry, some of the characteristics of light emitting diodes have presented challenges, some of which have not yet been fully met.

There is an ongoing need for a high efficiency solid-state white light source that combines the efficiency and long life of white LED lamps with an acceptable color temperature and good color rendering index, good contrast, a wide gamut and simple control circuitry.

BRIEF SUMMARY OF THE INVENTION

In a first aspect of the present invention, there is provided a lighting device comprising at least one plural cavity element and a plurality of solid state light emitters, in which the plural cavity element has at least two optical cavities (each comprising a concave region in the plural cavity element) and in which at least one of the solid state light emitters is present in each of at least two of the optical cavities.

In a second aspect of the present invention, there is provided a lighting device comprising at least one encapsulant region, at least one plural cavity element (having at least two optical cavities), and a plurality of solid state light emitters, at least one solid state light emitter being present in each of at least two of the optical cavities. In this aspect of the present invention, at least a portion of the plural cavity element, with the solid state light emitters mounted on optical cavities of the plural cavity element, is surrounded by the encapsulant region. In some embodiments according to this aspect of the invention, the plural cavity element is embedded in the encapsulant region.

In some embodiments according to the present invention, at least one broad spectrum light emitter (defined below) is provided in a first of the optical cavities and at least one narrow spectrum light emitter (defined below) is provided in a second of the optical cavities.

In some embodiments according to the present invention, walls of each of the optical cavities are reflective.

In some embodiments according to the present invention, the plural cavity element comprises a first surface, the first surface being substantially planar, the first surface having a surface area which is at least five times as large as a combined surface area of the solid state light emitters. In some such embodiments, each of the optical cavities formed in the plural cavity element comprises a substantially planar mounting surface on which at least one of the solid state light emitters is mounted.

In some embodiments according to the present invention, the plural cavity element comprises a first side and a second side, the first side comprises a substantially planar first surface and a plurality of substantially flat mounting surfaces, at least one of the solid state light emitters is mounted on each of the mounting surfaces, each of the mounting surfaces is substantially coplanar, and the first surface and the mounting surfaces together comprise not less than 75% of a surface area of the first side of the plural cavity element.

The invention may be more fully understood with reference to the accompanying drawings and the following detailed description of the invention.

DETAILED DESCRIPTION OF THE INVENTION

As noted above, in the first aspect of the present invention, there is provided a lighting device comprising at least one plural cavity element having at least two optical cavities, and a plurality of solid state light emitters, at least one solid state light emitter being present in each of at least two of the optical cavities.

In the second aspect of the present invention, there is provided a lighting device comprising at least one encapsulant region, at least one plural cavity element (having at least two optical cavities), and a plurality of solid state light emitters, at least one solid state light emitter being present in each of at least two of the optical cavities.

The plural cavity element can comprise any suitable structure which includes a plurality of optical cavities, each comprising a concave region in the plural cavity element. Persons skilled in the art can readily envision a wide variety of materials out of which the plural cavity element can be made. For example, in general, any material which has been used to make cup reflectors for LEDs can be employed in making the plural cavity element. Such materials include any of the materials which can be used to make leadframes (persons of skill in the art are familiar with a variety of materials which can be used to make leadframes) and/or which can be "stamped" to form such an element (persons of skill in the art are familiar with such materials and with "stamping" such materials). For instance, representative examples of materials out of which the plural cavity element can be made include silver-plated copper and silver-plated steel (and other metallic materials which can optionally be ovennolded, on their sides and/or bottoms, with a reflective surface). Conversely, the plural cavity element can be made from an insulating material (e.g., Amodel, which is aluminum which has been anodized, steel with a ceramic coating, etc.), upon which conductive traces can be formed. The expression "conductive trace", as used herein, refers to a structure which comprises a conductive portion, and may further include any other structure, e.g., one or more insulating layers.

The cavities alined in the plural cavity element can generally be of any desired concave shape. Persons of skill in the art are familiar with shaping cup reflectors in order to obtain favorable properties, particularly with regard to extracting the maximum amount of light from the light emitter contained within the cup, and the principles involved in such design of cup reflectors can be applied to the design of the cavities in the plural cavity element according to the present invention.

In some embodiments of the present invention, each of the cavities in a plural cavity element has substantially the same shape.

As used herein, the term "substantially," e.g., in the expressions "substantially planar", "substantially flat", "substantially coplanar", "substantially the same shape", "substantially transparent", means at least about 90% correspondence with the feature recited, e.g.:

the expressions "substantially planar" and "substantially flat", as used herein, mean that at least 90% of the points in the surface which is characterized as being substantially flat are located on one of or between a pair of planes which are parallel and which are spaced from each other by a distance of not more than 5% of the largest dimension of the surface;

the expression "substantially coplanar", as used herein, means that at least 90% of the points in each of the surfaces which are characterized as being substantially coplanar are located on one of or between a pair of planes which are parallel and which are spaced from each other by a distance of not more than 5% of the largest dimension of the surface;

the expression "substantially the same shape", as used herein, means that angles and radii of curvature defined by respective surfaces on the respective items which are characterized as being substantially the same shape differ by not more than 5%;

the expression "substantially transparent", as used herein, means that the structure which is characterized as being substantially transparent allows passage of at least 90% of the light having a wavelength within the range emitted by the solid state light emitter.

The expression "saturated", as used herein, means having a purity of at least 85%, the Wuxi "purity" having a well-known meaning to persons skilled in the art, and procedures for calculating purity being well-known to those of skill in the art.

In some embodiments of the present invention, at least one of the walls of at least one of the cavities in the plural cavity element is reflective.

In some embodiments of the present invention, the plural cavity element comprises a first, substantially planar, surface in which the concave cavities are formed. In some such embodiments, the first surface has a surface area which is at least five times as large as a combined surface area of the solid state light emitters contained in the cavities.

In some embodiments of the present invention, at least one (and, in some embodiments, all) of the optical cavities formed in the plural cavity element comprises a substantially planar mounting surface on which at least one of the solid state light emitters is mounted.

In some embodiments of the present invention, each optical cavity in the plural cavity element comprises a substantially flat mounting surface, and each of the mounting surfaces are substantially coplanar.

In some embodiments of the present invention, the plural cavity element comprises a first side and a second side, the first side comprising a substantially planar first surface and a plurality of substantially flat mounting surfaces, at least one solid state light emitter being mounted on each of the mounting surfaces, each of the mounting surfaces being substantially coplanar, the first surface and the mounting surfaces together comprising not less than 75% of a surface area of the first side of the plural cavity element.

As noted above, in the first and second aspects of the present invention, the lighting device comprises a plurality of solid state light emitters. Any desired solid state light emitter or emitters can be employed in accordance with the present invention. Persons of skill in the art are aware of, and have ready access to, a wide variety of such emitters. Such solid state light emitters include inorganic and organic light emitters. Examples of types of such light emitters include light emitting diodes (inorganic or organic), laser diodes, thin film electroluminescent devices, light emitting polymers (LEPs), and polymer light emitting diodes (PLEDs), a variety of each of which are well-known in the art. Because these various solid state light emitters are well-known in the art, it is not necessary to describe them in detail, nor is it necessary to describe the materials out of which such devices are made.

The respective light emitters can be similar to one another, different from one another or any combination (i.e., there can be a plurality of solid state light emitters of one type, or one or more solid state light emitters of each of two or more types). The light emitters can each be of similar size, or one or more of the light emitters can be of a size which differs from one or more of the other light emitters (e.g., a lighting device can include a chip which emits blue light which is of a size of 1 square millimeter, and a chip which emits red light which is of a size of 300 square micrometers).

In some embodiments according to the present invention, each solid state light emitter is mounted in a separate optical cavity. In other embodiments according to the present invention, at least one optical cavity has more than one solid state light emitter (each of which emits light of similar wavelength, or one or more of which emit light of wavelength which differs from that of light emitted by one or more other solid state light emitter in the same cavity) mounted therein.

In some embodiments according to the present invention, one or more lumiphor is provided in at least one of the optical cavities. In most cases, only one or more solid state light emitters of a single color (and typically only a single solid state light emitter) is provided in any optical cavity (or cavities) in which one or more lumiphor is provided, in order to avoid undesired interaction between light from any solid state light emitter and such lumiphor(s). For example, where a particular optical cavity includes a light emitting diode which emits blue light and a lumiphor (e.g., a broad spectrum phosphor such as YAG:Ce) which, upon excitation, produces yellow light (whereby, as indicated above, light exiting the optical cavity is perceived as being white), in most cases, it would be desirable to not include in the same optical cavity any light emitting diodes which emit a color which differs from the blue light (it is possible to include multiple solid state light emitters which emit light of similar wavelength(s) in a single cavity, with one or more of the solid state light emitters being at least partially covered by one or more lumiphors, e.g., multiple blue LEDs covered by a single glob or multiple globs of phosphor-containing material(s)).

In some embodiments according to the present invention, at least one of the optical cavities can have mounted therein plural solid state light emitters of a single color or of plural colors. In some such embodiments, at least one of the optical cavities can have mounted therein two or more saturated solid state light emitters of a single color or of plural colors.

As noted above, in some embodiments according to the present invention, at least one broad spectrum light emitter is provided in a first of the optical cavities and at least one narrow spectrum light emitter is provided in a second of the optical cavities. In some such embodiments, there are provided a plurality of optical cavities in which at least one broad spectrum light emitter (wherein the respective broad spectrum light emitters in the different optical cavities are all similar, are all different or are any possible combination of similar and different) is provided and a plurality of optical cavities in which at least one narrow spectrum light emitter (wherein the respective narrow spectrum light emitters in the different optical cavities are all similar, are all different or are any possible combination of similar and different) is provided (optionally, there may further be other optical cavities in which other light emitters are provided).

The expression "broad spectrum light emitter" is used herein to refer to a light emitter which emits unsaturated light, i.e., light that has less than 85% purity. Such light emitter may comprise a single solid state light emitter and a single lumiphor, or a single solid state light emitter and a plurality of lumiphors, or a plurality of solid state light emitters and a single lumiphor, or a plurality of solid state light emitters and a plurality of lumiphors.

The expression "narrow spectrum light emitter" is used herein to refer to a light emitter which emits saturated light, i.e., light having a purity of 85% or higher (e.g., high purity red, cyan or blue, such as nearly monochromatic light emitters).

In some embodiments according to the present invention, a broad spectrum light emitter can comprise two or more sources of visible light (each of the sources of visible light being independently selected from among solid state light emitters and luminescent materials) which, if mixed in the absence of any other light, would produce a combined illumination which would be perceived as white or near-white. The expression "white light generating sources" is used herein to refer to combinations of two or more sources of visible light which produce light which, if combined in the absence of any other light, would produce an illumination which would be perceived as white or near-white.

In some embodiments according to the present invention, there is provided a lighting device in which a broad spectrum light emitter is provided in one or more optical cavities, and one or more saturated sources of light are provided in one or more other optical cavities, in order to adjust the color point (i.e., x, y chromaticity coordinates on the CIE chart) and/or to improve the CRI Ra of the light emitted from the lighting device.

In some embodiments according to the present invention, there is provided a lighting device in which a white light generating source having poor CRI (e.g., Ra of 75 or less) is provided in one or more optical cavities, and one or more saturated sources of light are provided in one or more other optical cavities, in order to increase the CRI Ra of the light from the white light generating source.

In accordance with the present invention, by providing different solid state light emitters in different optical cavities of a single plural cavity element, as opposed to providing the different emitters in separate and distinct cup reflectors, blending of the light emitted from the respective solid state light emitters (and from any lumiphors) can be achieved in a shorter distance.

In accordance with the second aspect of the present invention, by providing different solid state light emitters in different optical cavities of a single plural cavity element embedded in a single encapsulant region, as opposed to providing the different emitters in separate and distinct packages, blending of the light emitted from the respective solid state light emitters (and from any lumiphors) can be achieved in a shorter distance.

In accordance with the present invention, by putting different light emitters in separate optical cavities, undesired interaction of light from the respective light emitters (and from any lumiphors) in the near field is avoided or reduced.

In accordance with the second aspect of the present invention, by providing different solid state light emitters in different optical cavities of a single plural cavity element embedded in a single encapsulant region, light emissions from each of the light emitters within the encapsulant region have a high degree of interaction in the far field (e.g., farther than 5 cm away from the light emitters).

In some embodiments according to the present invention, there is further provided the ability to control and/or adjust each solid state light emitter in the device by analog or digitally. Persons of skill in the art would readily be able to provide appropriate circuitry by which each solid state light emitter in devices according to the present invention can be independently controlled and/or adjusted.

In some embodiments of the second aspect of the present invention, the light exiting the respective solid state light emitters (and any lumiphors) contained in an encapsulant region is approximately 80% mixed by the time the light exits the encapsulant region, and such light is nearly completely mixed 5 cm away from the surface of the encapsulant region.

Specific examples of combinations of light emitters and/or lumiphors are described in U.S. Patent Application No. 60/752,555, filed Dec. 21, 2005, entitled "Lighting Device and Lighting Method" (inventors: Antony Paul Van de Ven and Gerald H. Negley), the entirety of which is hereby incorporated by reference).

Other representative examples of suitable combinations of light emissions include the following:

Specific examples of combinations of light emitters and/or lumiphors are described in:
  (a) U.S. Patent Application No. 60/752,555, filed Dec. 21, 2005, entitled "Lighting Device and Lighting Method" (inventors: Antony Paul Van de Ven and Gerald H. Negley), the entirety of which is hereby incorporated by reference.
  (b) U.S. Patent Application No. 60/793,524, filed Apr. 20, 2006, entitled "Lighting Device" (inventors: Antony Paul Van de Ven and Gerald H. Negley), the entirety of which is hereby incorporated by reference, and
  (c) U.S. Patent Application No. 60/793,518, filed Apr. 20, 2006, entitled "Lighting Device" (inventors: Antony Paul Van de Ven and Gerald H. Negley), the entirety of which is hereby incorporated by reference.

Included among such combinations of light emitters and/or lumiphors are:
  (1) A Combination Including:
  a first group of light emitting diodes;
  a first group of lumiphors; and
  a second group of light emitting diodes;
  wherein:
    each of the first group of light emitting diodes, if illuminated, would emit light having a peak wavelength in the range of from 430 nm to 480 nm;
    each of the first group of lumiphors, if excited, would emit light having a dominant wavelength in the range of from about 555 nm to about 585 nm; and each of the second group of light emitting diodes, if illuminated, would emit light having a dominant wavelength in the range of from 600 nm to 630 nm;

(2) A Combination Including:
a first group of light emitting diodes;
a first group of lumiphors;
a second group of light emitting diodes;
a second group of lumiphors; and
a third group of light emitting diodes;
wherein:
each of the first group of light emitting diodes and each of the second group of light emitting diodes, if illuminated, would emit light having a peak wavelength in the range of from 430 nm to 480 nm;
each of the first group of lumiphors and each of the second group of lumiphors, if excited, would emit light having a dominant wavelength in the range of from about 555 nm to about 585 nm; and
if each of the first group of light emitting diodes is illuminated and each of the first group of lumiphors is excited, a mixture of light emitted from the first group of light emitting diodes and the first group of lumiphors would, in the absence of any additional light, have a first group mixed illumination corresponding to a first point on a 1931 CIE Chromaticity Diagram, the first point having a first correlated color temperature;
if each of the second group of light emitting diodes is illuminated and each of the second group of lumiphors is excited, a mixture of light emitted from the second group of light emitting diodes and the second group of lumiphors would, in the absence of any additional light, have a second group mixed illumination corresponding to a second point on a 1931 CIE Chromaticity Diagram, the second point has a second correlated color temperature, the first correlated color temperature differs from the second correlated color temperature by at least 500K; and
each of the second group of light emitting diodes, if illuminated, would emit light having a dominant wavelength in the range of from 600 nm to 630 nm;

(3) A Combination Including:
a first group of light emitting diodes;
a first group of lumiphors; and
a second group of light emitting diodes;
wherein:
each of the first group of light emitting diodes, if illuminated, would emit light having a peak wavelength in the range of from 430 nm to 480 nm;
each of the first group of lumiphors, if excited, would emit light having a dominant wavelength in the range of from about 555 nm to about 585 nm;
each of the second group of light emitting diodes, if illuminated, would emit light having a dominant wavelength in the range of from 600 nm to 630 nm; and
if each of the first group of light emitting diodes is illuminated and each of the first group of lumiphors is excited, a mixture of light emitted from the first group of light emitting diodes and the first group of lumiphors would, in the absence of any additional light, have a first group mixed illumination having x, y color coordinates which are within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38; and (4) A Combination Including:
a first group of light emitting diodes;
a first group of lumiphors;
a second group of light emitting diodes;
a second group of lumiphors; and
a third group of light emitting diodes;
wherein:
each of the first group of light emitting diodes and each of the second group of light emitting diodes, if illuminated, would emit light having a peak wavelength in the range of from 430 nm to 480 nm;
each of the first group of lumiphors and each of the second group of lumiphors, if excited, would emit light having a dominant wavelength in the range of from about 555 nm to about 585 nm; and
if each of the first group of light emitting diodes is illuminated and each of the first group of lumiphors is excited, a mixture of light emitted from the first group of light emitting diodes and the first group of lumiphors would have a first group mixed illumination corresponding to a first point on a 1931 CIE Chromaticity Diagram, the first point having a first correlated color temperature;
if each of the second group of light emitting diodes is illuminated and each of the second group of lumiphors is excited, a mixture of light emitted from the second group of light emitting diodes and the second group of lumiphors would have a second group mixed illumination corresponding to a second point on a 1931 CIE Chromaticity Diagram, the second point has a second correlated color temperature, the first correlated color temperature differs from the second correlated color temperature by at least 500K;
each of the third group of light emitting diodes, if illuminated, would emit light having a dominant wavelength in the range of from 600 nm to 630 nm; and
if each of the first group of light emitting diodes is illuminated, each of the first group of lumiphors is excited, each of the second group of light emitting diodes is excited and each of the second group of lumiphors is excited, a mixture of light emitted from the first group of light emitting diodes, the first group of lumiphors, the second group of light emitting diodes and the second group of lumiphors, in the absence of any other light, would have a first group-second group mixed illumination which, in the absence of any other light, would have x, y color coordinates which are within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38.

Other representative examples of suitable combinations of light emissions include the following:

(1) A Combination Including:
a first group of light emitting diodes;
a first group of lumiphors; and
a second group of light emitting diodes;
wherein:
each of the first group of light emitting diodes, if illuminated, would emit light having a peak wavelength in the range of from 430 nm to 480 nm;
each of the first group of lumiphors, if excited, would emit light having a dominant wavelength in the range of from about 555 nm to about 585 nm; and
each of the second group of light emitting diodes, if illuminated, would emit light having a dominant wavelength in the range of from 610 nm to 630 nm;

(2) A Combination Including:
a first group of light emitting diodes;
a first group of lumiphors;
a second group of light emitting diodes;
a second group of lumiphors; and
a third group of light emitting diodes;
wherein:
each of the first group of light emitting diodes and each of the second group of light emitting diodes, if illuminated, would emit light having a peak wavelength in the range of from 430 nm to 480 nm;
each of the first group of lumiphors and each of the second group of lumiphors, if excited, would emit light having a dominant wavelength in the range of from about 555 nm to about 585 nm; and
if each of the first group of light emitting diodes is illuminated and each of the first group of lumiphors is excited, a mixture of light emitted from the first group of light emitting diodes and the first group of lumiphors would, in the absence of any additional light, have a first group mixed illumination corresponding to a first point on a 1931 CIE Chromaticity Diagram, the first point having a first correlated color temperature;
if each of the second group of light emitting diodes is illuminated and each of the second group of lumiphors is excited, a mixture of light emitted from the second group of light emitting diodes and the second group of lumiphors would, in the absence of any additional light, have a second group mixed illumination corresponding to a second point on a 1931 CIE Chromaticity Diagram, the second point has a second correlated color temperature, the first correlated color temperature differs from the second correlated color temperature by at least 500K; and
each of the second group of light emitting diodes, if illuminated, would emit light having a dominant wavelength in the range of from 610 nm to 630 nm;

(3) A Combination Including:
a first group of light emitting diodes;
a first group of lumiphors;
a second group of light emitting diodes; and
a third group of light emitting diodes,
wherein:
if each of the first group of light emitting diodes is illuminated and each of the first group of lumiphors is excited, a mixture of light emitted from the first group of light emitting diodes and the first group of lumiphors would, in the absence of any additional light, have a first group mixed illumination having x, y color coordinates which are within an area on a 1931 CIE Chromaticity Diagram enclosed by first, second, third and fourth line segments, the first line segment connecting a first point to a second point, the second line segment connecting the second point to a third point, the third line segment connecting the third point to a fourth point, and the fourth line segment connecting the fourth point to the first point, the first point having x, y coordinates of 0.30, 0.27, the second point having x, y coordinates of 0.30, 0.37, the third point having x, y coordinates of 0.34, 0.27, and the fourth point having x, y coordinates of 0.34, 0.37;
each of the second group of light emitting diodes, if illuminated, would emit light having a dominant wavelength in the range of from 600 nm to 630 nm; and
each of the third group of light emitting diodes, if illuminated, would emit light having a dominant wavelength in the range of from 490 nm to 510 nm;

(4) A Combination Including:
a first group of light emitting diodes;
a first group of lumiphors;
a second group of light emitting diodes; and
a third group of light emitting diodes,
wherein:
if each of the first group of light emitting diodes is illuminated and each of the first group of lumiphors is excited, a mixture of light emitted from the first group of light emitting diodes and the first group of lumiphors would, in the absence of any additional light, have a first group mixed illumination having x, y color coordinates which are within an area on a 1931 CIE Chromaticity Diagram enclosed by first, second, third and fourth line segments, the first line segment connecting a first point to a second point, the second line segment connecting the second point to a third point, the third line segment connecting the third point to a fourth point, and the fourth line segment connecting the fourth point to the first point, the first point having x, y coordinates of 0.30, 0.27, the second point having x, y coordinates of 0.30, 0.37, the third point having x, y coordinates of 0.34, 0.27, and the fourth point having x, y coordinates of 0.34, 0.37;
each of the second group of light emitting diodes, if illuminated, would emit light having a dominant wavelength in the range of from 600 nm to 630 nm; and
each of the third group of light emitting diodes, if illuminated, would emit light having a dominant wavelength in the range of from 520 nm to 550 nm;

(5) A Combination Including:
a first group of light emitting diodes;
a first group of lumiphors;
a second group of light emitting diodes; and
a third group of light emitting diodes
wherein:
each of the first group of light emitting diodes, if illuminated, would emit light having a peak wavelength in the range of from 430 nm to 480 nm;
each of the first group of lumiphors, if excited, would emit light having a dominant wavelength in the range of from about 555 nm to about 585 nm; and
each of the second group of light emitting diodes, if illuminated, would emit light having a dominant wavelength in the range of from 610 nm to 630 nm;
each of the third group of light emitting diodes, if illuminated, would emit light having a peak wavelength in the range of from 430 nm to 480 nm;

(6) A Combination Including:
a first group of light emitting diodes;
a first group of lumiphors;
a second group of light emitting diodes;
a second group of lumiphors;

a third group of light emitting diodes; and
a fourth group of light emitting diodes;
wherein:
each of the first group of light emitting diodes and each of the second group of light emitting diodes, if illuminated, would emit light having a peak wavelength in the range of from 430 nm to 480 nm;
each of the first group of lumiphors and each of the second group of lumiphors, if excited, would emit light having a dominant wavelength in the range of from about 555 nm to about 585 nm; and
if each of the first group of light emitting diodes is illuminated and each of the first group of lumiphors is excited, a mixture of light emitted from the first group of light emitting diodes and the first group of lumiphors would, in the absence of any additional light, have a first group mixed illumination corresponding to a first point on a 1931 CIE Chromaticity Diagram, the first point having a first correlated color temperature;
if each of the second group of light emitting diodes is illuminated and each of the second group of lumiphors is excited, a mixture of light emitted from the second group of light emitting diodes and the second group of lumiphors would, in the absence of any additional light, have a second group mixed illumination corresponding to a second point on a 1931 CIE Chromaticity Diagram, the second point has a second correlated color temperature, the first correlated color temperature differs from the second correlated color temperature by at least 500K; and
each of the third group of light emitting diodes, if illuminated, would emit light having a dominant wavelength in the range of from 610 nm to 630 nm;
each of the fourth group of light emitting diodes, if illuminated, would emit light having a peak wavelength in the range of from 430 nm to 480 nm;

These combinations listed above enable mixing of the desired spectrum to achieve light that is perceived as white, on or within 10 (or 20, or 40) MacAdam ellipses from the blackbody curve (in some cases on or within 5 MacAdam ellipses from the blackbody curve, and in some cases on or within 2 MacAdam ellipses from the blackbody curve), while achieving high color rendering indices (greater than 85).

As noted above, one type of solid state light emitter which can be employed are LEDs. Such LEDs can be selected from among any light emitting diodes (a wide variety of which are readily obtainable and well known to those skilled in the art, and therefore it is not necessary to describe in detail such devices, and/or the materials out of which such devices are made). For instance, examples of types of light emitting diodes include inorganic and organic light emitting diodes, a variety of each of which are well-known in the art.

As noted above, in the first and second aspects of the present invention, the lighting device comprises an encapsulant region. Persons of skill in the art are familiar with, and have easy access to, a wide variety of materials which are suitable for use in making an encapsulant region for a packaged LED, and any such materials can, if desired, be employed. For example, two well-known representative classes of materials out of which the encapsulant region can be constructed include epoxies and silicones.

Persons of skill in the art are also familiar with a wide variety of suitable shapes for the encapsulant region, and the encapsulant region(s) in the device according to the present invention can be of any such shape. Persons of skill in the art are also familiar with various ways to make a packaged device incorporating the various elements described herein in connection with the present invention. Accordingly, further description of materials for use in making the encapsulant region, shapes for the encapsulant region and methods of making the devices described herein is not needed.

Any suitable structure or structures can be employed to provide power to the solid state light emitters, and persons of skill in the art are familiar with and can devise a wide variety of such structures. One representative example of such a structure is a leadframe with one or more wires connected to the light emitter, which is a structure with which persons of skill in the art are very familiar. Skilled artisans are also familiar with materials which are used for making leadframes (representative examples of such materials including copper and steel materials which can be "stamped" to faun the leadframes) and for making wires.

As noted above, in some embodiments according to the present invention, the lighting device further comprises at least one lumiphor (i.e., luminescence region or luminescent element which comprises at least one luminescent material). The one or more luminescent materials, when provided, can be in any desired form and can be selected from among phosphors, scintillators, day glow tapes, inks which glow in the visible spectrum upon illumination with ultraviolet light, etc. The luminescent element can, if desired, be embedded in a resin (i.e., a polymeric matrix), such as a silicone material, an epoxy, a substantially transparent glass or a metal oxide material. The expression "lumiphor", as used herein, refers to any luminescent element, i.e., any element which includes a luminescent material, a variety of which are readily available and well-known to those skilled in the art.

The one or more lumiphors can individually be any lumiphor, a wide variety of which, as noted above, are known to those skilled in the art. For example, the or each lumiphor can comprise (or can consist essentially of, or can consist of) one or more phosphor. The or each of the one or more lumiphors can, if desired, further comprise (or consist essentially of, or consist of) one or more highly transmissive (e.g., transparent or substantially transparent, or somewhat diffuse) binder, e.g., made of epoxy, silicone, glass, metal oxide or any other suitable material (for example, in any given lumiphor comprising one or more binder, one or more phosphor can be dispersed within the one or more binder). For example, the thicker the lumiphor, in general, the lower the weight percentage of the phosphor can be. Representative examples of the weight percentage of phosphor include from about 3.3 weight percent up to about 20 weight percent, although, as indicated above, depending on the overall thickness of the lumiphor, the weight percentage of the phosphor could be generally any value, e.g., from 0.1 weight percent to 100 weight percent (e.g., a lumiphor formed by subjecting pure phosphor to a hot isostatic pressing procedure).

Devices in which a lumiphor is provided can, if desired, further comprise one or more clear encapsulant (comprising, e.g., one or more silicone materials) positioned between the solid state light emitter (e.g., light emitting diode) and the lumiphor.

The or each of the one or more lumiphors can, independently, further comprise any of a number of well-known additives, e.g., diffusers, scatterers, tints, etc.

In some embodiments according to the first aspect of the present invention, the lighting device is shaped and sized so as to correspond with the shape and size of conventional lighting devices, e.g., currently, 5 mm LED packages, 3 mm LED packages, 7 mm LED packages, 10 mm LED packages and 12 mm LED packages, the sizes and shapes of which are well-known to those skilled in the art.

One or more brightness enhancement films can optionally further be included in the lighting devices according to this aspect of the present invention. Such films are well-known in the art and are readily available. Brightness enhancement films (e.g., BEF films commercially available from 3M) are optional—when employed, they provide a more directional light source by limiting the acceptance angle. Light not "accepted" is recycled by the highly reflective light source enclosure. Preferably, the brightness enhancement films (which can optionally be replaced by one or more extraction films, such as by WFT), if employed, are optimized to limit the viewing angle of the emitted source and to increase the probability of extracting light on the first (or earliest possible) pass.

In addition, one or more scattering elements (e.g., layers) can optionally be included in the lighting devices according to this aspect of the present invention. The scattering element can be included in a lumiphor, and/or a separate scattering element can be provided. A wide variety of separate scattering elements and combined luminescent and scattering elements are well known to those of skill in the art, and any such elements can be employed in the lighting devices of the present invention.

The lighting devices of the present invention can be arranged, mounted and supplied with electricity in any desired manner, and can be mounted on any desired housing or fixture. Skilled artisans are familiar with a wide variety of arrangements, mounting schemes, power supplying apparatuses, housings and fixtures, and any such arrangements, schemes, apparatuses, housings and fixtures can be employed in connection with the present invention. The lighting devices of the present invention can be electrically connected (or selectively connected) to any desired power source, persons of skill in the art being familiar with a variety of such power sources.

Representative examples of arrangements of lighting devices, schemes for mounting lighting devices, apparatus for supplying electricity to lighting devices, housings for lighting devices, fixtures for lighting devices and power supplies for lighting devices, all of which are suitable for the lighting devices of the present invention, are described in U.S. Patent Application No. 60/752,753, filed on Dec. 21, 2005, entitled "Lighting Device" (inventors: Gerald H. Negley, Antony Paul Van de Ven and Neal Hunter), the entirety of which is hereby incorporated by reference, and in U.S. Patent Application No. 60/798,446, filed on May 5, 2006, entitled "Lighting Device" (inventor: Antony Paul Van de Ven and Neal Hunter), the entirety of which is hereby incorporated by reference.

The devices according to the present invention can further comprise one or more long-life cooling device (e.g., a fan with an extremely high lifetime). Such long-life cooling device(s) can comprise piezoelectric or magnetorestrictive materials (e.g., MR, GMR, and/or HMR materials) that move air as a "Chinese fan". In cooling the devices according to the present invention, typically only enough air to break the boundary layer is required to induce temperature drops of 10 to 15 degrees C. Hence, in such cases, strong "breezes" or a large fluid flow rate (large CFM) are typically not required (thereby avoiding the need for conventional fans).

The devices according to the present invention can further comprise secondary optics to further change the projected nature of the emitted light. Such secondary optics are well-known to those skilled in the art, and so they do not need to be described in detail herein—any such secondary optics can, if desired, be employed.

The devices according to the present invention can further comprise sensors or charging devices or cameras, etc. For example, persons of skill in the art are familiar with, and have ready access to, devices which detect one or more occurrence (e.g., motion detectors, which detect motion of an object or person), and which, in response to such detection, trigger illumination of a light, activation of a security camera, etc. As a representative example, a device according to the present invention can include a lighting device according to the present invention and a motion sensor, and can be constructed such that (1) while the light is illuminated, if the motion sensor detects movement, a security camera is activated to record visual data at or around the location of the detected motion, or (2) if the motion sensor detects movement, the light is illuminated to light the region near the location of the detected motion and the security camera is activated to record visual data at or around the location of the detected motion, etc.

Figure 4:
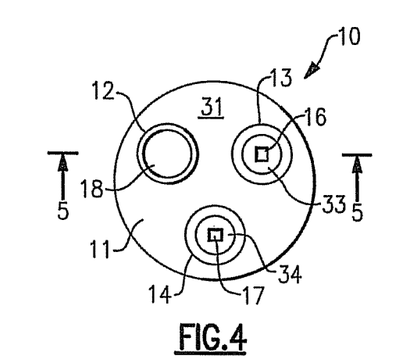
FIG. 4 depicts a first embodiment of a lighting device according to the present invention.
Figure 5:
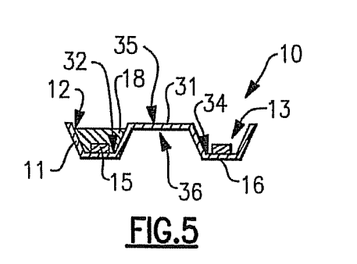
FIG. 5 is a cross-sectional view of the embodiment shown in FIG. 4, taken along the plane V-V.

FIG. 4 is a top view of an embodiment of a lighting device 10 according to the first aspect of the present invention. Referring to FIG. 4, the lighting device 10 includes a plural cavity element 11 which has three concave optical cavities 12, 13, 14, each containing a respective light emitting diode 15, 16, 17 (the light emitting diode 15 is shown in FIG. 5). A lumiphor 18 is also present in the optical cavity 12.

The plural cavity element comprises a first surface 31 which is substantially planar.

The first surface 31 has a surface area which is more than five times as large as a combined surface area of the light emitting diodes 15, 16, 17 (i.e., the surface areas of the surfaces (of the light emitting diodes 15, 16, 17) which face upward in FIG. 5).

Each of the optical cavities 12, 13, 14 comprises a substantially planar mounting surface 32, 33, 34, respectively, on which the respective light emitting diodes 15, 16, 17 are mounted.

FIG. 5 is a cross-sectional view of the embodiment shown in FIG. 4, taken along the plane V-V.

Referring to FIG. 5, the plural cavity element comprises a first side 35 and a second side 36, the first side comprising the first surface 31 and the mounting surfaces 32, 33, 34.

The mounting surfaces 32, 33, 34 are substantially coplanar. The first surface and the mounting surfaces together comprise not less than 75% of the surface area of the first side of the plural cavity element.

Figure 6:
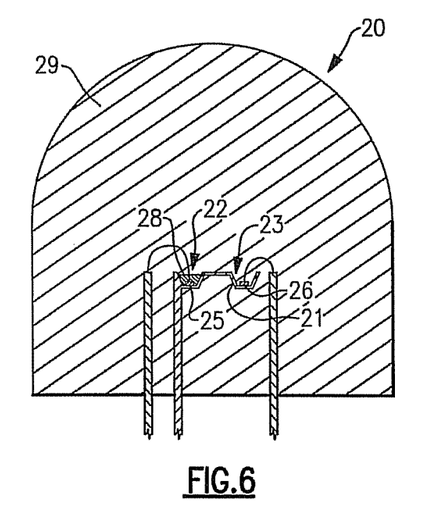
FIG. 6 depicts a second embodiment of a lighting device according to the present invention.

FIG. 6 is a cross-sectional view of an embodiment of a lighting device 20 according to the second aspect of the present invention. Referring to FIG. 6, the lighting device 20 includes a plural cavity element 21 which has three optical cavities (22, 23 and a third cavity, not visible in this view), each containing a respective light emitting diode (25, 26 and a third light emitting diode, not visible in this view). A lumiphor 28 is also present in the optical cavity 22. The plural cavity element 21 is surrounded by (and embedded in) an encapsulant region 29.

Figure 7:
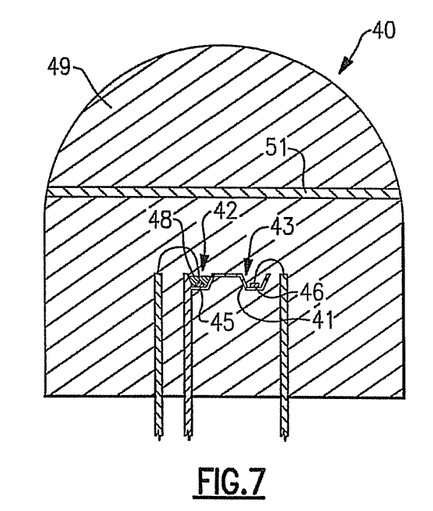
FIG. 7 is a cross-sectional view of another embodiment of a lighting device according to the present invention.

FIG. 7 is a cross-sectional view of another embodiment of a lighting device 40 according to the second aspect of the present invention. Referring to FIG. 7, the lighting device 40 includes a plural cavity element 41 which has three optical cavities (42, 43 and a third cavity, not visible in this view), each containing a respective light emitting diode (45, 46 and a third light emitting diode, not visible in this view). A lumiphor 48 is also present in the optical cavity 42. The plural cavity element 41 is surrounded by (and embedded in) an encapsulant region 49. The lighting device 40 further includes a scattering element 51 (in the form of a layer). A variety of scattering elements are well-known to persons skilled in the art, and any such scattering element can be employed in any of the devices according to the present invention. Persons skilled in the art can readily make such scattering elements, one example of a suitable way to provide a scattering element being by multiple casting to improve mixing.

Other representative embodiments according to the present invention are described below:

(1) a plural cavity element having at least one of a first type of optical cavity and at least one of a second type of optical cavity, the first type of optical cavity having mounted therein a blue light emitting diode and a yellow phosphor (e.g., YAG), the second type of optical cavity having mounted therein a red light emitting diode;

(2) a plural cavity element having at least one of a first type of optical cavity and at least one of a second type of optical cavity, the first type of optical cavity having mounted therein a blue light emitting diode and a yellow phosphor (e.g., YAG), the second type of optical cavity having mounted therein a blue light emitting diode;

(3) a plural cavity element having at least one of a first type of optical cavity, at least one of a second type of optical cavity and at least one of a third type of optical cavity, the first type of optical cavity having mounted therein a yellow light emitting diode, the second type of optical cavity having mounted therein a blue light emitting diode, the third type of optical cavity having mounted therein a red light emitting diode;

(4) a plural cavity element having at least one of a first type of optical cavity, at least one of a second type of optical cavity and at least one of a third type of optical cavity, the first type of optical cavity having mounted therein a blue light emitting diode with a yellow phosphor, the second type of optical cavity having mounted therein a blue light emitting diode, the third type of optical cavity having mounted therein a red light emitting diode;

(5) a plural cavity element having at least one of a first type of optical cavity, at least one of a second type of optical cavity and at least one of a third type of optical cavity, the first type of optical cavity having mounted therein a red light emitting diode, the second type of optical cavity having mounted therein a green light emitting diode, the third type of optical cavity having mounted therein a blue light emitting diode;

(6) a plural cavity element having at least one of a first type of optical cavity, at least one of a second type of optical cavity and at least one of a third type of optical cavity, the first type of optical cavity having mounted therein a light emitting diode and a green phosphor, the second type of optical cavity having mounted therein a red light emitting diode, the third type of optical cavity having mounted therein a blue light emitting diode;

(7) a plural cavity element having at least one of a first type of optical cavity and at least one of a second type of optical cavity, the first type of optical cavity having mounted therein a blue light emitting diode and a green phosphor, the second type of optical cavity having mounted therein a red light emitting diode;

(8) a plural cavity element having at least one of a first type of optical cavity, at least one of a second type of optical cavity and at least one of a third type of optical cavity, the first type of optical cavity having mounted therein a cyan light emitting diode, the second type of optical cavity having mounted therein an orange light emitting diode, the third type of optical cavity having mounted therein a "white" light emitting diode;

(9) a plural cavity element having at least one of a first type of optical cavity, at least one of a second type of optical cavity and at least one of a third type of optical cavity, the first type of optical cavity having mounted therein a cyan light emitting diode, the second type of optical cavity having mounted therein a red light emitting diode, the third type of optical cavity having mounted therein a "white" light emitting diode;

(10) a plural cavity element having at least one of a first type of optical cavity, at least one of a second type of optical cavity and at least one of a third type of optical cavity, the first type of optical cavity having mounted therein a light emitting diode and a yellow phosphor, the second type of optical cavity having mounted therein a red light emitting diode, the third type of optical cavity having mounted therein a cyan light emitting diode;

(11) a plural cavity element having at least one of a first type of optical cavity and at least one of a second type of optical cavity, the first type of optical cavity having mounted therein a cyan light emitting diode and a yellow phosphor, the second type of optical cavity having mounted therein a red light emitting diode; and (12) packaged devices including any of the above plural cavities (i.e., (1)-(11)) embedded in an encapsulant region.

Any two or more structural parts of the lighting devices described herein can be integrated. Any structural part of the lighting devices described herein can be provided in two or more parts (which are held together, if necessary). Similarly, any two or more functions can be conducted simultaneously, and/or any function can be conducted in a series of steps.

The invention claimed is:

1. A lighting device comprising:
at least one plural cavity element, said plural cavity element having at least two optical cavities, each of said optical cavities comprising a concave region in said plural cavity element;
at least two solid state light emitters, at least a first solid state light emitter in a first optical cavity and at least a second solid state light emitter in a second optical cavity, said first solid state light emitter comprising a first luminescent material, said second solid state light emitter comprising a second luminescent material, said first luminescent material differing from said second luminescent material, and
an encapsulant region, at least a portion of said plural cavity element outside said at least two optical cavities of said plural cavity element covered by said encapsulant region.

2. A lighting device as recited in claim 1, wherein:
said plural cavity element further comprises a third optical cavity,
at least a third solid state light emitter is in said third optical cavity, and
said third solid state light emitter is a narrow spectrum solid state light emitter.

3. A lighting device as recited in claim 1, wherein:
said first solid state light emitter comprises a first light emitting diode which emits light having a first wavelength range,
said second solid state light emitter comprises a second light emitting diode which emits light having a second wavelength range, and
said first wavelength range differs from said second wavelength range.

4. A lighting device as recited in claim 1, wherein walls of said optical cavities are reflective.

5. A lighting device as recited in claim 1, wherein:
said plural cavity element comprises a first surface,
said first surface is substantially planar, and
said first surface has a surface area which is at least five times as large as a combined surface area of said solid state light emitters.

6. A lighting device as recited in claim 1, wherein:
said plural cavity element comprises a first side and a second side, said first side comprises a substantially planar first surface and a plurality of substantially flat mounting surfaces, at least one of said solid state light emitters is mounted on each of said mounting surfaces, said mounting surfaces substantially coplanar, and said first surface and said mounting surfaces together comprise not less than 75% of a surface area of said first side of said plural cavity element.

7. A lighting device as recited in claim 1, wherein said plural cavity element is embedded in said encapsulant region.

8. A lighting device comprising:

at least one plural cavity element, said plural cavity element having at least two optical cavities, each of said optical cavities comprising a concave region in said plural cavity element; and at least two solid state light emitters, at least a first solid state light emitter in a first optical cavity and at least a second solid state light emitter in a second optical cavity, said first solid state light emitter comprising a broad spectrum luminescent material, said second solid state light emitter a narrow spectrum solid state light emitter whereby narrow spectrum light is emitted from said second optical cavity.

9. A lighting device as recited in claim 8, wherein said first solid state light emitter comprises a first light emitting diode which emits light having a first wavelength range, said second solid state light emitter comprises a second light emitting diode which emits light having a second wavelength range, and said first wavelength range differs from said second wavelength range.

10. A lighting device as recited in claim 8, wherein:

said plural cavity element further comprises a third optical cavity, at least a third solid state light emitter is in said third optical cavity, and said third solid state light emitter is a narrow spectrum solid state light emitter.

11. A lighting device as recited in claim 8, wherein walls of said optical cavities are reflective.

12. A lighting device as recited in claim 8, wherein:

said plural cavity element comprises a first surface, said first surface is substantially planar, and said first surface has a surface area which is at least five times as large as a combined surface area of said solid state light emitters.

13. A lighting device as recited in claim 8, wherein:

said plural cavity element comprises a first side and a second side, said first side comprises a substantially planar first surface and a plurality of substantially flat mounting surfaces, at least one of said solid state light emitters is mounted on each of said mounting surfaces, said mounting surfaces are substantially coplanar, and said first surface and said mounting surfaces together comprise not less than 75% of a surface area of said first side of said plural cavity element.

14. A lighting device as recited in claim 8, wherein:

said lighting device further comprises an encapsulant region, and at least a portion of said plural cavity element is covered by said encapsulant region.

15. A lighting device as recited in claim 14, wherein said plural cavity element is embedded in said encapsulant region.

16. A lighting device comprising:

at least one plural cavity element, said plural cavity element having at least two optical cavities, each of said optical cavities comprising a concave region in said plural cavity element;

at least two solid state light emitters, at least one of said solid state light emitters in each of at least two of said optical cavities; and an encapsulant region, said at least two solid state light emitters arranged electrically in parallel, at least a portion of said plural cavity element outside said at least two optical cavities of said plural cavity element covered by said encapsulant region.

17. A lighting device as recited in claim 16, wherein at least one broad spectrum solid state light emitter is provided in a first of said optical cavities and at least one narrow spectrum solid state light emitter is provided in a second of said optical cavities.

18. A lighting device as recited in claim 16, wherein:

said plural cavity element further comprises a third optical cavity, at least a third solid state light emitter is in said third optical cavity, and said third solid state light emitter is a narrow spectrum solid state light emitter.

19. A lighting device as recited in claim 16, wherein:

a first solid state light emitter comprises a first light emitting diode which emits light having a first wavelength range, a second solid state light emitter comprises a second light emitting diode which emits light having a second wavelength range, and said first wavelength range differs from said second wavelength range.

20. A lighting device as recited in claim 16, wherein:

said plural cavity element further comprises a third optical cavity, at least a third solid state light emitter is in said third optical cavity, and said third solid state light emitter is arranged electrically in parallel with said at least two solid state light emitters.

* * * * *